US010388493B2

(12) United States Patent
Singh et al.

(10) Patent No.: US 10,388,493 B2
(45) Date of Patent: Aug. 20, 2019

(54) COMPONENT OF A SUBSTRATE SUPPORT ASSEMBLY PRODUCING LOCALIZED MAGNETIC FIELDS

(75) Inventors: Harmeet Singh, Fremont, CA (US); Keith Gaff, Fremont, CA (US); Brett Richardson, San Ramon, CA (US); Sung Lee, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1589 days.

(21) Appl. No.: 13/234,473

(22) Filed: Sep. 16, 2011

(65) Prior Publication Data

US 2013/0072025 A1    Mar. 21, 2013

(51) Int. Cl.
*H01F 7/20* (2006.01)
*H01J 37/32* (2006.01)
*H01L 21/67* (2006.01)
*H01L 21/311* (2006.01)

(52) U.S. Cl.
CPC .. *H01J 37/32669* (2013.01); *H01J 37/32715* (2013.01); *H01L 21/31116* (2013.01); *H01L 21/67069* (2013.01); *H01F 7/20* (2013.01)

(58) Field of Classification Search
CPC ......... H01L 21/67109; H01L 21/67103; H01L 21/67248; H01L 21/6831; H01L 2924/0002; H01L 2924/00; H01L 21/67069; H01L 21/3065; H01L 21/6833; H01L 21/31116; H01L 21/32136; H01L 21/67115; H01L 21/672; H01J 37/321–3211
USPC ....................................................... 118/500
See application file for complete search history.

(56) References Cited

U.S. PATENT DOCUMENTS

| 3,440,883 A | 4/1969 | Lightner |
| 4,099,228 A | 7/1978 | Cohn |
| 4,692,836 A * | 9/1987 | Suzuki ................ H01L 21/6831 279/128 |

(Continued)

FOREIGN PATENT DOCUMENTS

| JP | 601918 A | 1/1985 |
| JP | 621176 A | 1/1987 |

(Continued)

OTHER PUBLICATIONS

International Preliminary Report on Patentability dated Mar. 18, 2014 for PCT/US2012/053386.

(Continued)

*Primary Examiner* — Benjamin Kendall
*Assistant Examiner* — Mirza Israr Javed

(57) ABSTRACT

A component of a substrate support assembly such as a substrate support or edge ring includes a plurality of current loops incorporated in the substrate support and/or the edge ring. The current loops are laterally spaced apart and extend less than halfway around the substrate support or edge ring with each of the current loops being operable to induce a localized DC magnetic field of field strength less than 20 Gauss above a substrate supported on the substrate support during plasma processing of the substrate. When supplied with DC power, the current loops generate localized DC magnetic fields over the semiconductor substrate so as to locally affect the plasma and compensate for non-uniformity in plasma processing across the substrate.

20 Claims, 15 Drawing Sheets

(56) References Cited

U.S. PATENT DOCUMENTS

| | | |
|---|---|---|
| 5,059,770 A | 10/1991 | Mahawili |
| 5,255,520 A | 10/1993 | O'Geary et al. |
| 5,414,245 A | 5/1995 | Hackleman |
| 5,436,528 A * | 7/1995 | Paranjpe ............ H01J 37/321 313/231.31 |
| 5,504,471 A | 4/1996 | Lund |
| 5,515,683 A | 5/1996 | Kessler |
| 5,536,918 A | 7/1996 | Ohkase et al. |
| 5,635,093 A | 6/1997 | Arena et al. |
| 5,665,166 A | 9/1997 | Deguchi et al. |
| 5,667,622 A | 9/1997 | Hasegawa et al. |
| 5,740,016 A | 4/1998 | Dhindsa |
| 5,745,332 A * | 4/1998 | Burkhart ............ H01L 21/6833 361/234 |
| 5,802,856 A | 9/1998 | Schaper et al. |
| 5,851,298 A | 12/1998 | Ishii |
| 5,880,923 A * | 3/1999 | Hausmann .......... H01L 21/6833 279/128 |
| 5,886,866 A | 3/1999 | Hausmann |
| 5,994,675 A | 11/1999 | Bethune et al. |
| 6,060,697 A | 5/2000 | Morita et al. |
| 6,091,060 A | 7/2000 | Getchel et al. |
| 6,095,084 A * | 8/2000 | Shamouilian ............ C23C 16/00 118/723 E |
| 6,100,506 A | 8/2000 | Colelli, Jr. et al. |
| 6,175,175 B1 | 1/2001 | Hull |
| 6,216,632 B1 | 4/2001 | Wickramanayaka |
| 6,222,161 B1 | 4/2001 | Shirakawa et al. |
| 6,271,459 B1 | 8/2001 | Yoo |
| 6,332,710 B1 | 12/2001 | Aslan et al. |
| 6,339,997 B1 * | 1/2002 | Nakagawa ............ C23C 16/4401 118/723 AN |
| 6,342,997 B1 | 1/2002 | Khadkikar et al. |
| 6,353,209 B1 | 3/2002 | Schaper et al. |
| 6,403,403 B1 | 6/2002 | Mayer et al. |
| 6,475,336 B1 * | 11/2002 | Hubacek ............ C23C 16/4585 118/723 E |
| 6,483,690 B1 | 11/2002 | Nakajima et al. |
| 6,495,963 B1 * | 12/2002 | Bennett ................ H01J 37/321 118/723 E |
| 6,512,207 B1 | 1/2003 | Dress et al. |
| 6,523,493 B1 | 2/2003 | Brcka |
| 6,566,632 B1 | 5/2003 | Katata et al. |
| 6,612,673 B1 | 9/2003 | Giere et al. |
| 6,664,515 B2 | 12/2003 | Natsuhara et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,795,292 B2 | 9/2004 | Grimard et al. |
| 6,815,365 B2 | 11/2004 | Masuda et al. |
| 6,825,617 B2 | 11/2004 | Kanno et al. |
| 6,835,290 B2 | 12/2004 | Reiter et al. |
| 6,847,014 B1 | 1/2005 | Benjamin et al. |
| 6,870,728 B1 | 3/2005 | Burket et al. |
| 6,886,347 B2 | 5/2005 | Hudson et al. |
| 6,921,724 B2 | 7/2005 | Kamp et al. |
| 6,979,805 B2 | 12/2005 | Arthur et al. |
| 6,985,000 B2 | 1/2006 | Feder et al. |
| 6,989,210 B2 | 1/2006 | Gore |
| 7,075,031 B2 | 7/2006 | Strang et al. |
| 7,141,763 B2 | 11/2006 | Moroz |
| 7,173,222 B2 | 2/2007 | Cox et al. |
| 7,175,714 B2 | 2/2007 | Ootsuka et al. |
| 7,206,184 B2 | 4/2007 | Ennis |
| 7,230,204 B2 | 6/2007 | Mitrovic et al. |
| 7,250,309 B2 | 7/2007 | Mak et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 | 8/2008 | Barnett, Jr. et al. |
| 7,430,984 B2 | 10/2008 | Hanawa et al. |
| 7,475,551 B2 | 1/2009 | Ghoshal |
| 7,480,129 B2 | 1/2009 | Brown et al. |
| 7,504,006 B2 | 3/2009 | Gopalraja et al. |
| 7,512,359 B2 | 3/2009 | Sugiyama |
| 7,718,932 B2 | 5/2010 | Steger |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,136,820 B2 | 3/2012 | Morioka et al. |
| 8,168,050 B2 | 5/2012 | Lu |
| 8,207,476 B2 | 6/2012 | Tsukamoto et al. |
| 8,222,574 B2 | 7/2012 | Sorabji et al. |
| 8,295,026 B2 | 10/2012 | Matsuyama |
| 8,461,674 B2 | 6/2013 | Gaff et al. |
| 8,536,492 B2 | 9/2013 | Ramamurthy et al. |
| 8,546,732 B2 | 10/2013 | Singh |
| 8,624,168 B2 | 1/2014 | Gaff et al. |
| 8,637,794 B2 | 1/2014 | Singh et al. |
| 8,642,480 B2 | 2/2014 | Gaff et al. |
| 8,791,392 B2 | 7/2014 | Singh |
| 8,809,747 B2 | 8/2014 | Pease et al. |
| 2002/0043528 A1 | 4/2002 | Ito |
| 2003/0150712 A1 | 8/2003 | Reiter et al. |
| 2004/0110388 A1 | 6/2004 | Yan et al. |
| 2005/0016465 A1 * | 1/2005 | Ramaswamy ...... H01L 21/6833 118/728 |
| 2005/0120956 A1 * | 6/2005 | Suzuki .................... C23C 14/50 118/719 |
| 2005/0215073 A1 | 9/2005 | Nakamura et al. |
| 2006/0191637 A1 | 8/2006 | Zajac et al. |
| 2006/0226123 A1 | 10/2006 | Birang |
| 2006/0229854 A1 | 10/2006 | Grichnik et al. |
| 2007/0000918 A1 | 1/2007 | Steinhauser et al. |
| 2007/0125762 A1 | 6/2007 | Cui et al. |
| 2008/0029195 A1 | 2/2008 | Lu |
| 2008/0049374 A1 | 2/2008 | Morioka et al. |
| 2008/0202924 A1 | 8/2008 | Bluck et al. |
| 2009/0000738 A1 * | 1/2009 | Benjamin ............ H01J 37/321 156/345.28 |
| 2009/0173445 A1 * | 7/2009 | Yeom .................... H01J 37/321 156/345.49 |
| 2009/0183677 A1 | 7/2009 | Tian et al. |
| 2009/0215201 A1 | 8/2009 | Benjamin et al. |
| 2010/0078424 A1 | 4/2010 | Tsukamoto et al. |
| 2010/0116788 A1 | 5/2010 | Singh et al. |
| 2010/0163546 A1 | 7/2010 | Nanno et al. |
| 2010/0257871 A1 | 10/2010 | Venkatasubramanian et al. |
| 2010/0283565 A1 | 11/2010 | Blakes |
| 2011/0005682 A1 | 1/2011 | Savas et al. |
| 2011/0033175 A1 | 2/2011 | Kasai et al. |
| 2011/0092072 A1 * | 4/2011 | Singh .................... C23C 14/541 438/710 |
| 2011/0095689 A1 * | 4/2011 | Gilbert .................. H01J 37/321 315/111.51 |
| 2011/0108706 A1 | 5/2011 | Koyama |
| 2011/0143462 A1 | 6/2011 | Gaff et al. |
| 2012/0031889 A1 | 2/2012 | Komatsu |
| 2012/0097661 A1 | 4/2012 | Singh |
| 2012/0115254 A1 | 5/2012 | Singh |
| 2013/0003250 A1 | 1/2013 | Morimoto et al. |
| 2013/0072035 A1 | 3/2013 | Gaff et al. |
| 2013/0220989 A1 | 8/2013 | Pease et al. |
| 2014/0048529 A1 | 2/2014 | Pease et al. |

FOREIGN PATENT DOCUMENTS

| | | |
|---|---|---|
| JP | 06010391 | 3/1994 |
| JP | H06-077146 A | 3/1994 |
| JP | H09-087839 A | 3/1997 |
| JP | H11-283926 A | 10/1999 |
| JP | 2002-313535 A | 10/2002 |
| JP | 2004152913 A | 5/2004 |

(56) References Cited

FOREIGN PATENT DOCUMENTS

| JP | 2005123286 A | 5/2005 |
|---|---|---|
| JP | 2005294237 A | 10/2005 |
| JP | 2006-509365 A | 3/2006 |
| JP | 2007081160 A | 3/2007 |
| JP | 2007082374 A | 3/2007 |
| JP | 2009267256 A | 11/2009 |
| JP | 2010153730 A | 7/2010 |
| JP | 2010-225941 A | 10/2010 |
| JP | 2011-018684 A | 1/2011 |
| KR | 201998028601 U | 8/1998 |
| KR | 1020050053464 A | 6/2005 |
| KR | 20050121913 A | 12/2005 |
| KR | 1020060067552 A | 6/2006 |
| KR | 20080058109 A | 6/2008 |

OTHER PUBLICATIONS

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.

International Search Report and Written Opinion dated Nov. 16, 2012 for PCT/US2012/053386.

Commonly-Owned Utility U.S. Appl. No. 12/910,347, filed Oct. 22, 2010.

Commonly-Owned Utility U.S. Appl. No. 12/943,492, filed Nov. 10, 2010.

Commonly-Owned Utility U.S. Appl. No. 13/237,444, filed Sep. 20, 2011.

Commonly-Owned Utility U.S. Appl. No. 13/238,396, filed Sep. 21, 2011.

Taiwanese First Office Action dated Mar. 16, 2016 by Taiwanese Intellectual Property Office in Taiwanese Application No. 101132350 (with English language translation).

Office Action (Notification of the Final Office Action) dated Apr. 26, 2016, by the Korean Patent Office in corresponding Korean Patent Application No. 10-2013-7012033, and a Partial English Translation of the Office Action. (5 pages).

Office Action (Notice of Reasons for Rejection) dated Aug. 9, 2016, by the Japanese Patent Office in corresponding Japanese Patent Application No. 2014-530690, and an English Translation of the Office Action. (13 pages).

Notification of Transmittal of the International Search Report (Forms PCT/ISA/220 and PCT/ISA/210) and the Written Opinion of the International Searching Authority (Form PCT/ISA/237) dated Oct. 23, 2012, in the International Application No. PCT/US2012/051029. (12 pages).

Notification of Transmittal of the International Search Report (Forms PCT/ISA/220 and PCT/ISA/210) and the Written Opinion of the International Searching Authority (Form PCT/ISA/237) dated Apr. 4, 2013, in the International Application No. PCT/US2013/023823. (9 pages).

Notification Concerning Transmittal of International Preliminary Report on Patentability (Forms PCT/IB/326 and PCT/IB/373) and the Written Opinion of the International Searching Authority (Form PCT/ISA/237) dated Sep. 12, 2014, by the International Bureau of WIPO in the International Application No. PCT/US2013/023823. (7 pages).

* cited by examiner

U.S. 10,388,493 B2

COMPONENT OF A SUBSTRATE SUPPORT ASSEMBLY PRODUCING LOCALIZED MAGNETIC FIELDS

FIELD OF THE INVENTION

Disclosed herein is a component of a substrate support assembly having a plurality of current loops adapted to generate small magnetic fields and compensate for variations during plasma processing of a semiconductor substrate supported on the substrate support assembly. The component can be an edge ring or substrate support such as a tunable electrostatic chuck (ESC) that allows for improved control of critical dimension (CD) uniformity, as well as methods and uses thereof.

BACKGROUND

In this specification where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

Commonly-owned U.S. Pat. No. 6,921,724 discloses an etch processor for etching a wafer that includes an ESC for holding a wafer and a temperature sensor reporting a temperature of the wafer. The chuck includes a heater controlled by a temperature control system and a temperature sensor is operatively coupled to the temperature control system to maintain the temperature of the ESC at a selectable set-point temperature. A first set-point temperature and a second set-point temperature are selected. The wafer is placed on the chuck and set to the first set-point temperature. The wafer is then processed for a first period of time at the first set-point temperature and for a second period of time at the second set-point temperature.

Commonly-owned U.S. Pat. No. 6,847,014 discloses a ESC for a plasma processor comprising a temperature-controlled base, a thermal insulator, a flat support, and a heater. The temperature-controlled base has a temperature below the desired temperature of a substrate. The thermal insulator is disposed over the temperature-controlled base. The flat support holds a substrate and is disposed over the thermal insulator. A heater is embedded within the flat support and/or disposed on an underside of the flat support and includes a plurality of heating elements that heat a plurality of corresponding heating zones. The power supplied and/or temperature of each heating element is controlled independently.

Commonly-owned U.S. Patent Publication No. 2011/0092072 discloses a heating plate for a substrate support assembly in a semiconductor plasma processing apparatus comprising multiple independently controllable planar heater zones arranged in a scalable multiplexing layout, and electronics to independently control and power the planar heater zones.

Thus, there is a need for a component of a substrate support assembly, such as a substrate support assembly comprising an ESC or edge ring, which is capable of making spatial corrections and/or adjustments to the azimuthal plasma processing rate non-uniformity to correct for film thickness variation, etch chamber induced etch rate non-uniformity and large magnetic field (from plasma generation) induced non-uniformity.

While certain aspects of conventional technologies have been discussed to facilitate disclosure of the invention, Applicant in no way disclaims these technical aspects, and it is contemplated that the claimed invention may encompass or include one or more of the conventional technical aspects discussed herein.

SUMMARY

Disclosed herein is a component of a substrate support assembly comprising an edge ring or substrate support incorporating a plurality of current loops which generate small magnetic fields in a plasma during plasma processing of at least one semiconductor substrate. The component creates a localized magnetic field without the need for a permanent magnet or iron core. The magnetic fields are small enough to avoid damage to circuits undergoing processing on the semiconductor substrate but strong enough to affect the plasma so as to increase or decrease localized plasma processing such as etch rates during plasma etching. The spatial adjustments to the localized plasma processing rates can compensate for film thickness variation, chamber non-uniformity and/or magnetic field induced non-uniformity.

During plasma processing such as etching, the current loops can be powered to manipulate the plasma and effect spatial adjustments to an azimuthal plasma to correct for film thickness variation, chamber non-uniformity and/or magnetic field induced non-uniformity.

DETAILED DESCRIPTION OF THE PREFERRED EMBODIMENTS

Precise azimuthal CD control on a substrate by small (e.g., <5° C.) corrections azimuthally to the substrate temperature can address CD uniformity which is sensitive to substrate temperature (e.g., as high as 1 nm/° C.). For example, even with an azimuthally symmetric etch chamber design, film thickness non-uniformity can result in azimuthal etch rate non-uniformity, as regions of substrate with thinner films undergo film clearing faster than other regions on the substrate. Small variabilities in hardware also contribute to azimuthal etch rate non-uniformity (e.g., <1%). Large applied DC magnetic fields (e.g., >20 Gauss), such as those used for plasma generation, can be a source of etch rate non-uniformity in plasma etching. Such a magnetic field induces a force, F, defined by F=E×B (where E is the electric field in the plasma and B is the magnetic field) on electrons in the plasma which results in azimuthal non-uniformity in the plasma during plasma etching, such non-uniformity in the plasma can lead to non-uniformity in the etch rate.

Figure 1:
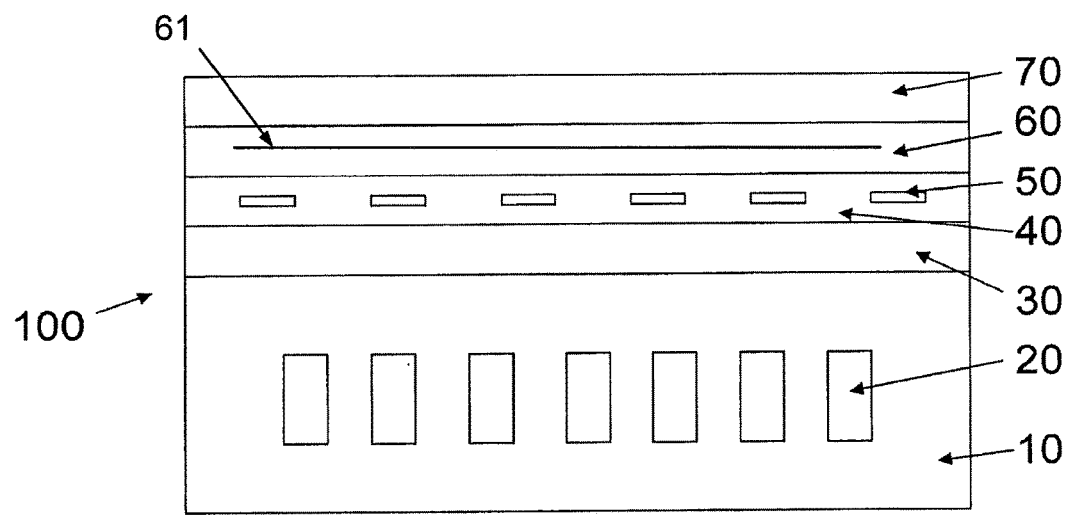
FIG. 1 shows a cross-sectional view of a substrate support assembly comprising an ESC.

FIG. 1 shows a cross-sectional perspective of a substrate 70 and substrate support assembly 100 comprising a tunable ESC. The tunable ESC comprises a baseplate 10 with coolant fluid channels 20 disposed therethrough. A thermal insulating layer 30 is disposed on baseplate 10. A heating plate 40 is disposed on insulating layer 30 and comprises an array of discrete heating zones 50 distributed laterally across the substrate support and is operable to tune a spatial temperature profile for CD control. A ceramic plate 60 is disposed on heating plate 40. A substrate 70 is disposed over the ceramic plate 60 and is electrostatically clamped to the ESC by an electrostatic chucking electrode 61 embedded in the ceramic plate. It is noted that a substrate support 100 may comprise a standard, or non-tunable, ESC, instead of a tunable ESC. The substrate support assembly is adapted to support substrates of at least about 200 mm in diameter, or at least about 300 mm in diameter or at least about 450 mm in diameter. The materials of the components are not particularly limited. Baseplate 10 is preferably made from a suitable thermal conductor, such as aluminum or stainless steel. Ceramic plate 60 is preferably made from a suitable ceramic material, such as aluminum oxide (Ah03) or aluminum nitride (AlN). Thermal insulating layer 30 preferably comprises a silicone material, which adheres baseplate 10 to heating plate 40. An epoxy, silicone or metallurgical bond is preferably used to adhere heating plate 40 to ceramic plate 60.

Under operational conditions (e.g., plasma etching), DC magnetic fields used for plasma generation are a known source of etch rate non-uniformity. For example, a magnetic field parallel to the plane of substrate undergoing processing in the plasma volume is expected to induce non-uniformity in the azimuthal etch rate pattern with about 5% etch rate non-uniformity induced per Gauss of applied magnetic field. Thin film thickness variation and etch chamber hardware variation are also known to contribute to azimuthal etch rate non-uniformity.

The induced non-uniformity can be used to make adjustments to the azimuthal etch rate pattern using applied DC magnetic fields. These applied magnetic fields are relatively small (e.g., <20 Gauss or <10 Gauss, preferably ≤1 Gauss or ≤½ Gauss) and allow for localized corrections to the plasma processing such as etch rate to be made without significantly affecting other etch parameters (e.g. CD uniformity, substrate temperature). For example, the relatively small applied magnetic field also minimizes potential damage to circuits on a substrate being etched. Thus, when an azimuthal etch rate non-uniformity is detected in an etching process, such as those induced by film thickness variation, etch chamber hardware and the magnetic field of the plasma, a localized magnetic field above a substrate and generated from the substrate support can be used to make adjustments to an azimuthal etch rate pattern. Similar results can be obtained in other plasma processing such as plasma assisted deposition.

Figure 2A:
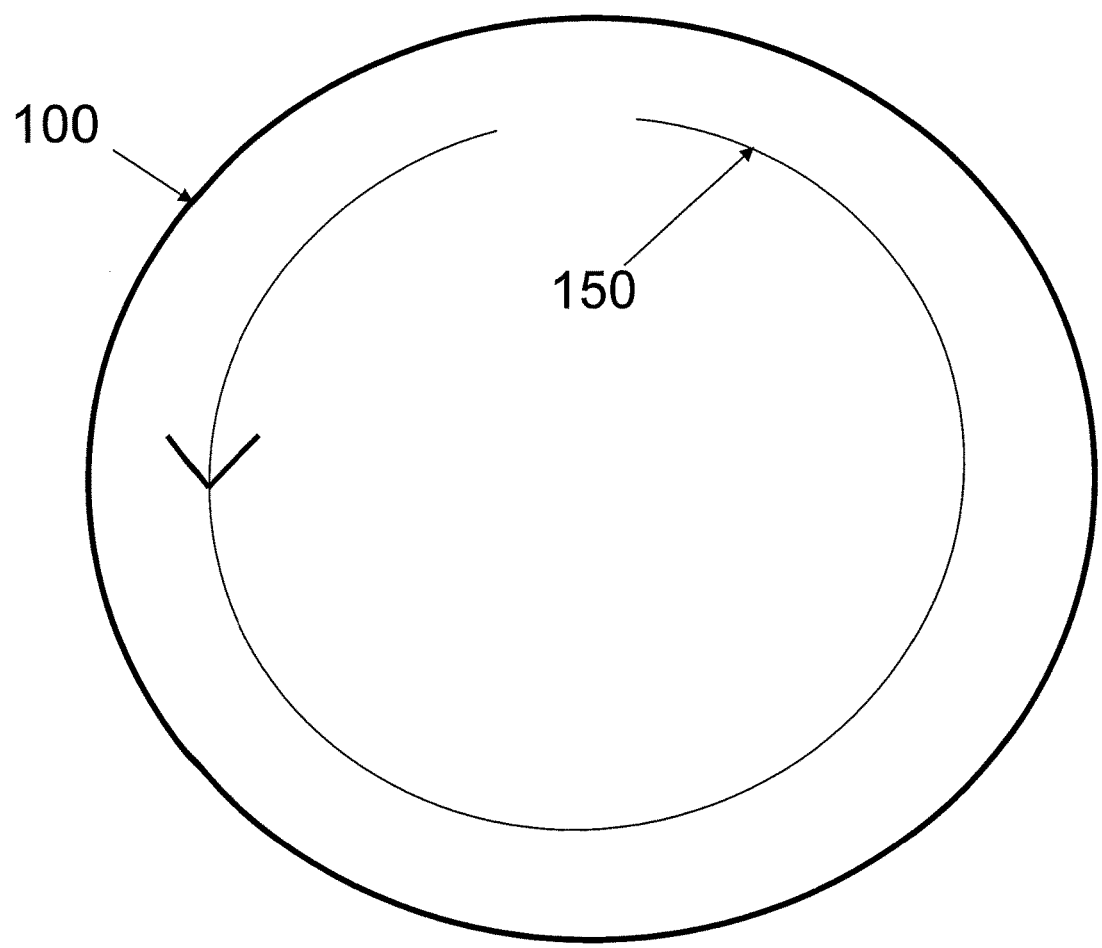
FIG. 2 shows a top view (FIG. 2A) of a component of a substrate support assembly in accordance with an embodiment and a cross-sectional view (FIG. 2B) of the associated perpendicular applied magnetic field.
FIG. 2C shows a controller, DC power source(s), and current loop(s).
Figure 2B:
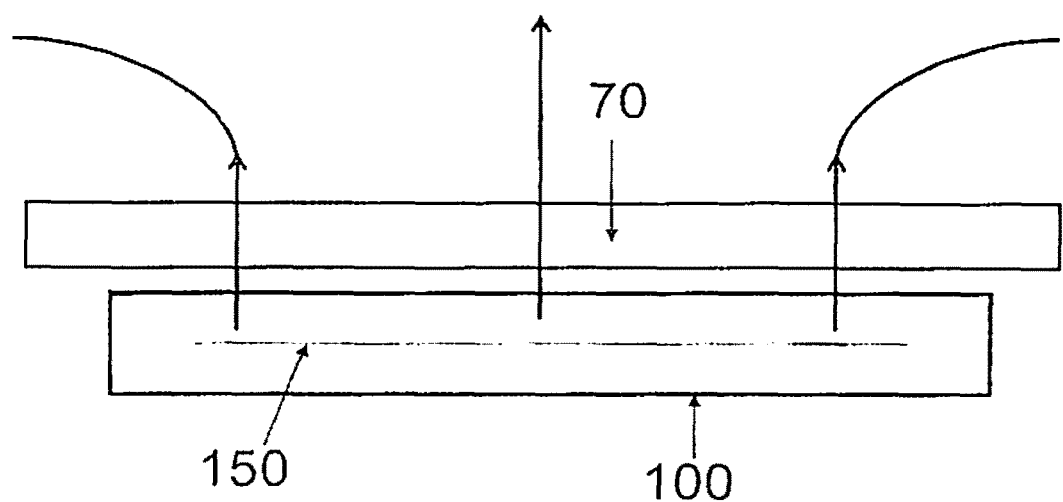

To apply such a localized magnetic field, at least one current carrying conductor (current loop) may be powered. FIG. 2 illustrates a current carrying conductor 150 embedded in a component of a substrate support assembly 100 (FIG. 2A). When DC current flows through the current carrying conductor 150, a magnetic field is generated predominantly in a direction perpendicular (FIG. 2B) to substrate support assembly 100 and substrate 70. Under operational conditions (e.g., plasma etching), the conductor 150 is operated independently of the other components of substrate support assembly 100, such as RF to the baseplate 10 and power to the heating plate 40 and voltage to the ESC. The conductor 150 is adapted to generate a DC magnetic field when DC power is supplied thereto by electrical leads running through the body of the component.

In order to generate small magnetic fields, a plurality of conductors 150 are laterally spaced across the substrate support and/or edge ring at locations suitable to generate applied magnetic fields effective to make corrections and/or adjustments to plasma processing such as an etch rate pattern. The conductors 150 may be located in a component such as an ESC ceramic, such as ceramic plate 60. The conductors 150 may be located in another component, such as baseplate 10. The conductors 150 may also be located in hardware adjacent the substrate support, such as an edge ring. Preferably, the current carrying conductors 150 are placed inside baseplate 10, such that any heat generated due to electrical current flow inside the conductors does not substantially alter the substrate temperature. If incorporated in baseplate 10, the conductors 150 are preferably wires with an electrically insulating sheath.

The current carrying conductor 150 may preferably comprise a wire, cable or conductive trace that is electrically isolated from its surroundings to ensure that the applied DC current only flows inside the conductor and not within the substrate support component in which it is embedded. Electrical isolation may be realized by providing a thin electrically insulating layer, or layers, surrounding current carrying conductor 150. For example, if current carrying conductor 150 is disposed in a component that is electrically conductive, a thin layer, or layers, of electrically insulating material or sheath is disposed around the conductor for electrical isolation. The electrically insulating material may comprise a Kapton film, an epoxy film, a silicone film and combinations thereof. If current carrying conductor 150 is disposed in a component that is electrically non-conductive, a thin layer, or layers, of electrically insulating material or sheath is not required for electrical isolation. The material of conductor 150 preferably comprises copper, but may be comprised of other materials with a suitable electrical conductivity.

The conductor 150 may be disposed within a component of a substrate support such that it forms a current loop 150. The current loop 150 may be formed into any desirable shape within the component and with reference to the plane of the upper surface of the substrate 70 and is preferably circular or semi-circular. Other shapes may be oval, semi-oval, square, rectangular, trapezoidal, triangular or other polygonal shape. If a wire is chosen for conductor 150 to be incorporated in ceramic plate 60, a wire may be placed at a desired location in a mold containing powder starting materials of the component. The molded component is then fired to form the component. If a conductive trace is chosen for conductor 150, a powder starting material of the trace may be formed into a pattern in a powder molding, with subsequent firing of the molding to form the component. If a conductive trace is chosen for conductor 150 and is to be placed on an outer surface of a component, a metal or other material may be plated on the component, with subsequent etching of the metal or other material to form the current loop on the component. If an individual wire is chosen as the conductor 150 and is to be formed on an upper surface of a component, a groove may be machined into the surface with dimensions suitable for receiving the wire and the insulated wire can be mounted in the groove with a suitable adhesive.

Figure 3:
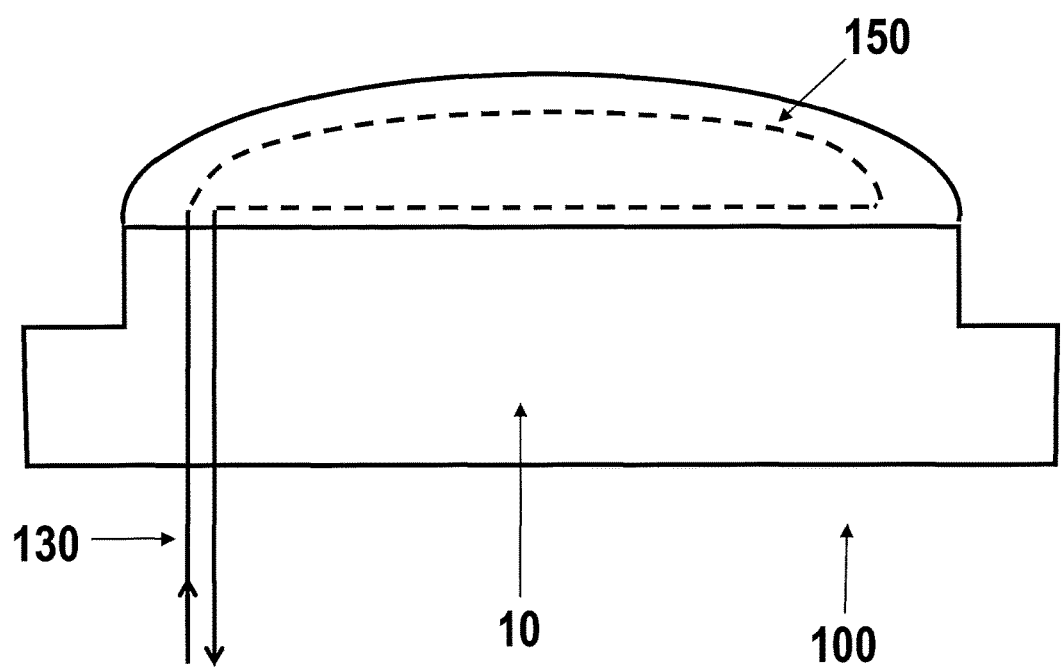
FIG. 3 shows a perspective view of a component of a substrate support assembly in accordance with an embodiment.

The current loop 150 can be supplied DC power by electrical leads connected thereto. FIG. 3 shows a perspective view of a substrate support assembly 100 comprising current loop 150 with leads 130 for power supply (up arrow) and power return (down arrow). The current loop 150 is disposed in or on baseplate 10. The leads are spaced a few mm apart such that the magnetic fields generated on the leads, and particularly those proximate the current loop 150, cancel each other out and do not interfere in the magnetic field over the substrate 70 being etched (FIG. 2A).

A current loop, or loops, may comprise a single turn. However, a current loop, or loops, comprising a plurality of turns to form a coil, or coil-like, structure are also contemplated. The coil, or coil-like, structure may reduce the DC current required for generating the applied magnetic field during an etching process. The embodiments of the current loop, or loops, are preferably disposed in planes parallel to the substrate. However, the current loop, or loops, may be disposed in planes that are not parallel to the substrate if such a disposition is desired.

The dimensions of current carrying conductor 150 are not particularly limited so long as the dimensions render its applied magnetic field effective to make corrections and/or adjustments to the plasma to achieve uniform processing such as an azimuthal etch rate pattern. The length of current carrying conductor 150 may be chosen such that the corresponding current loop 150 may be shaped into a desired form. For example, if a 300 mm diameter wafer is to be etched, each localized magnetic field can be generated by a single circular shaped current loop formed with a loop diameter between about 1-150 mm and preferably between about 1-75 mm. Depending on the shape of the current loop and the desired number of currently loops in the substrate support, the length of an individual current loop may be 5-1000 mm, e.g., 5-50 mm or 50-1000 mm, such as in the case of a component comprising up to two hundred current loops. The diameter of current carrying conductor 150 itself is also not particularly limited and may be any diameter or dimension that forms a suitable applied localized magnetic field. For example, if a 300 mm diameter wafer is to be etched, the current loop may be a wire with a diameter of between about 0.5 mm-10 mm and preferably between about 0.5 mm-5 mm. If a conductive trace is to be the current loop 150, the trace may be formed in a rectangular shape with a thickness of between about 0.5 mm-10 mm, preferably between about 0.5 mm-5 mm, and a width of between about 0.5 mm-10 mm, preferably between about 0.5 mm-5 mm. The direction of current flowing in the current loop is not particularly limited and may be either clockwise or counter-clockwise. Preferably, the current flowing in current loop 150 is adapted to be reversible to switch the direction of the current flow, and thus, switching the direction of the applied DC magnetic field, if desired.

Figure 2C:
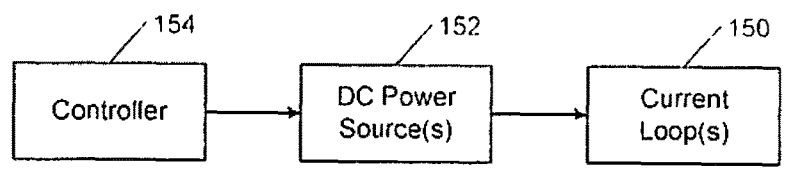

For purposes of explanation, FIG. 2 shows an embodiment of a component of a substrate support assembly 100 comprising a single current loop 150. However, to provide localized magnetic fields it is desirable to have a plurality of current loops 150 in the substrate support. A plurality of current loops 150 allows for reduction of DC current required for a localized magnetic field strength over a substrate. An advantage of a plurality of current loops 150 is that each loop can be operated independently of one another such that each current loop may be supplied varying power levels and processing non-uniformity can be corrected and/or adjusted more efficiently. If each of the current loops 150 in the plurality of current loops is independently operable, further fine tuning capabilities are imparted to the applied magnetic field over the substrate. Preferably, as shown in FIG. 2C, the plurality of current loops 150 are connected to one or more DC power sources 152 controlled by a controller 154 such that the loops can be supplied power at the same or different times with the same or different power levels. Preferably, the DC power source, or sources, comprise a multiplexed powering scheme and can supply power to each current loop 150 such that each loop can be individually tuned by time-domain multiplexing. Preferably, the periphery of each current loop 150 in a plurality of current loops is laterally offset from the periphery of an adjacent current loop such that no overlap occurs. Preferably, the plurality of current loops 150 are disposed in a laterally symmetric or equidistant manner such that a plane that vertically intersects the center of the component where the loops are disposed produces substantial mirror images of each half of the component. The current loops 150 in the component are preferably arranged in a defined pattern, for example, a rectangular grid, a hexagonal grid, a polar array or any desired pattern.

Figure 4:
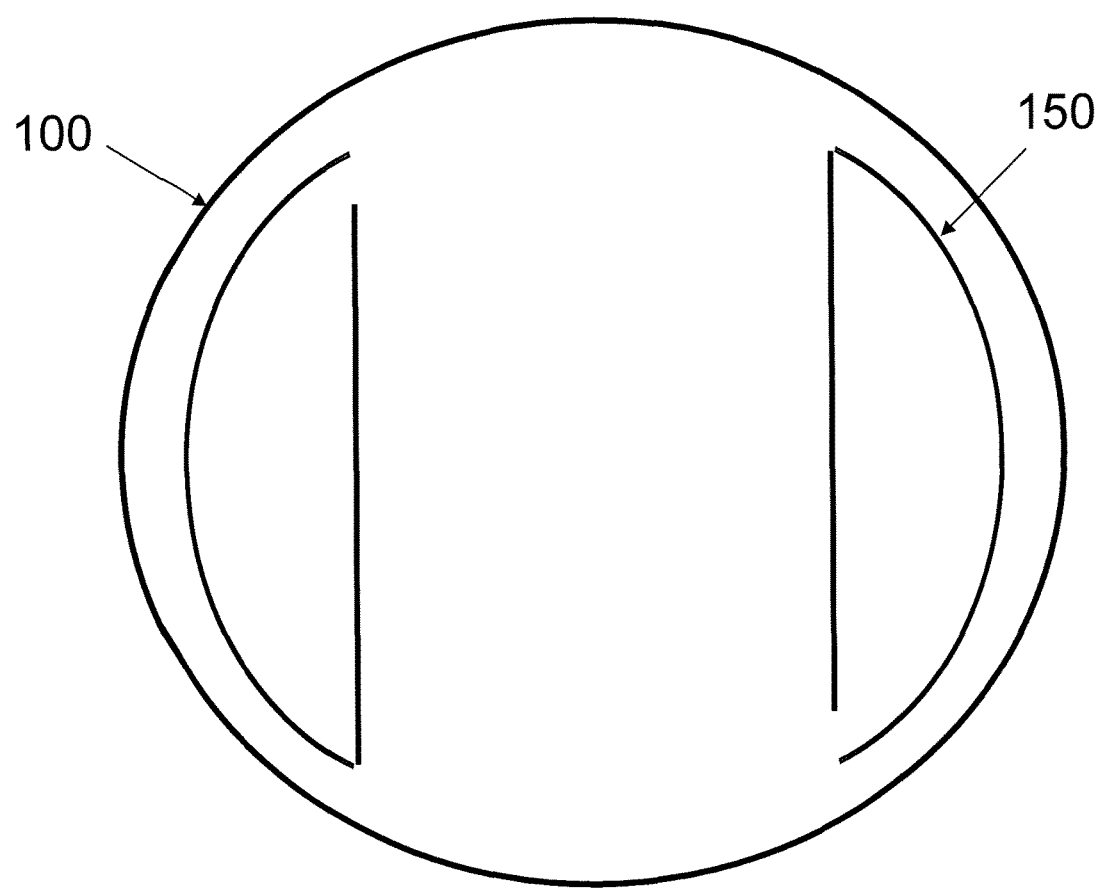
FIG. 4 shows a top view of a component of a substrate support assembly in accordance with another embodiment.

FIG. 4 shows a preferred embodiment of a component of a substrate support assembly 100 wherein substrate support 100 comprises a plurality of current loops 150. FIG. 4 shows a preferred embodiment having two separate current loops 150 which are D-shaped and having their straight legs facing each other. The current loops 150 may be of the same size or may be of different sizes. Preferably, each of the current loops 150 extends less than about halfway around the support or edge ring. The current loops 150 are shown as being disposed towards a peripheral area of the substrate support component, but may also be disposed at any radial position desired. When the currents of these two loops are applied in the same direction (e.g., both clockwise or both counter-clockwise), a magnetic field similar to that shown in FIG. 2A is generated. When the currents of the two loops are applied in opposite directions (e.g., one clockwise and one counter-clockwise), certain portions of the applied magnetic field are cancelled over the center of the substrate.

Figure 5:
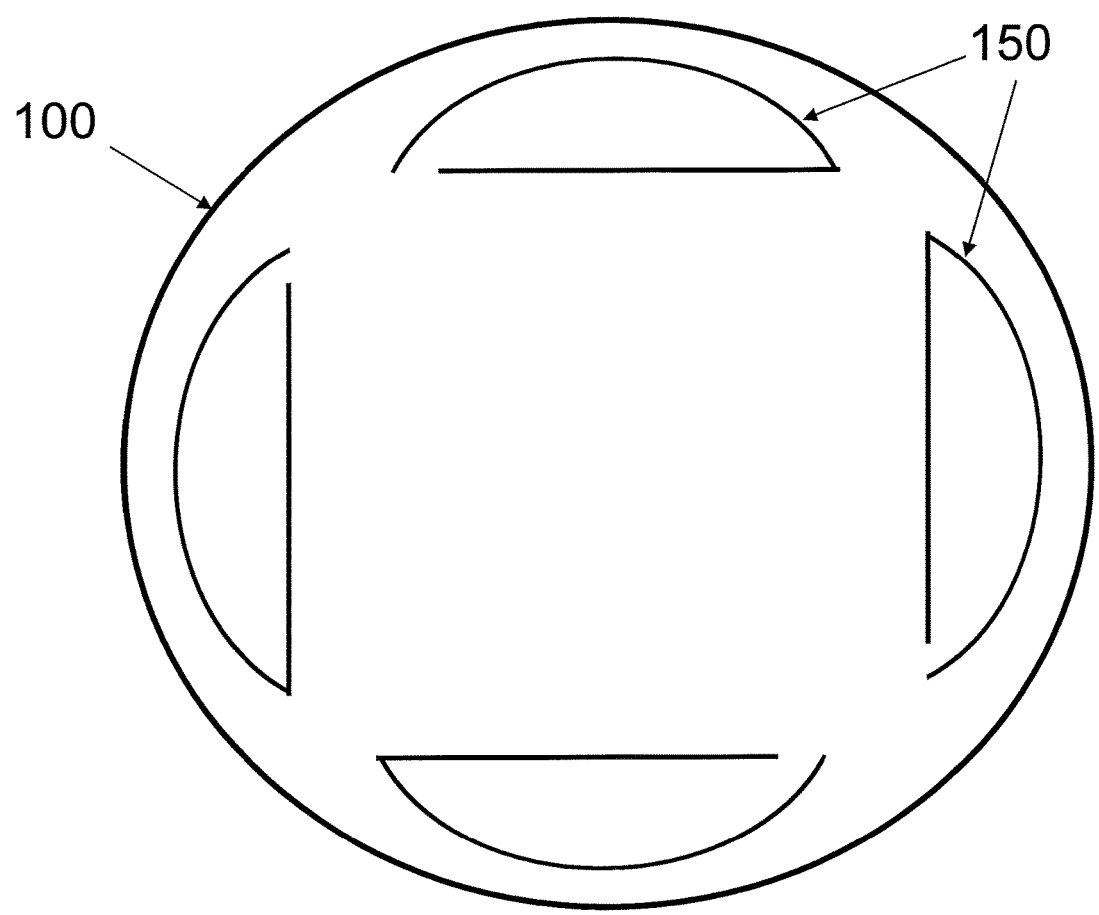
FIG. 5 shows a top view of a component of a substrate support assembly in accordance with yet another embodiment.

FIG. 5 shows a preferred embodiment of a component of a substrate support assembly 100 wherein a substrate support 100 comprises multiple current loops 150. FIG. 5 shows a preferred embodiment with four separate current loops 150 which are each D-shaped and having their straight legs facing inward. Similar to those shown in FIG. 4, the current loops 150 are shown as being disposed towards a peripheral area of the substrate support component, but may also be disposed at any radial position desired. The four current loops 150 are capable of generating applied magnetic fields in various directions over the substrate depending on the direction of the current in each of the four loops 150, similar to the applied magnetic field generated by the two separate loops in FIG. 4.

Figure 6:
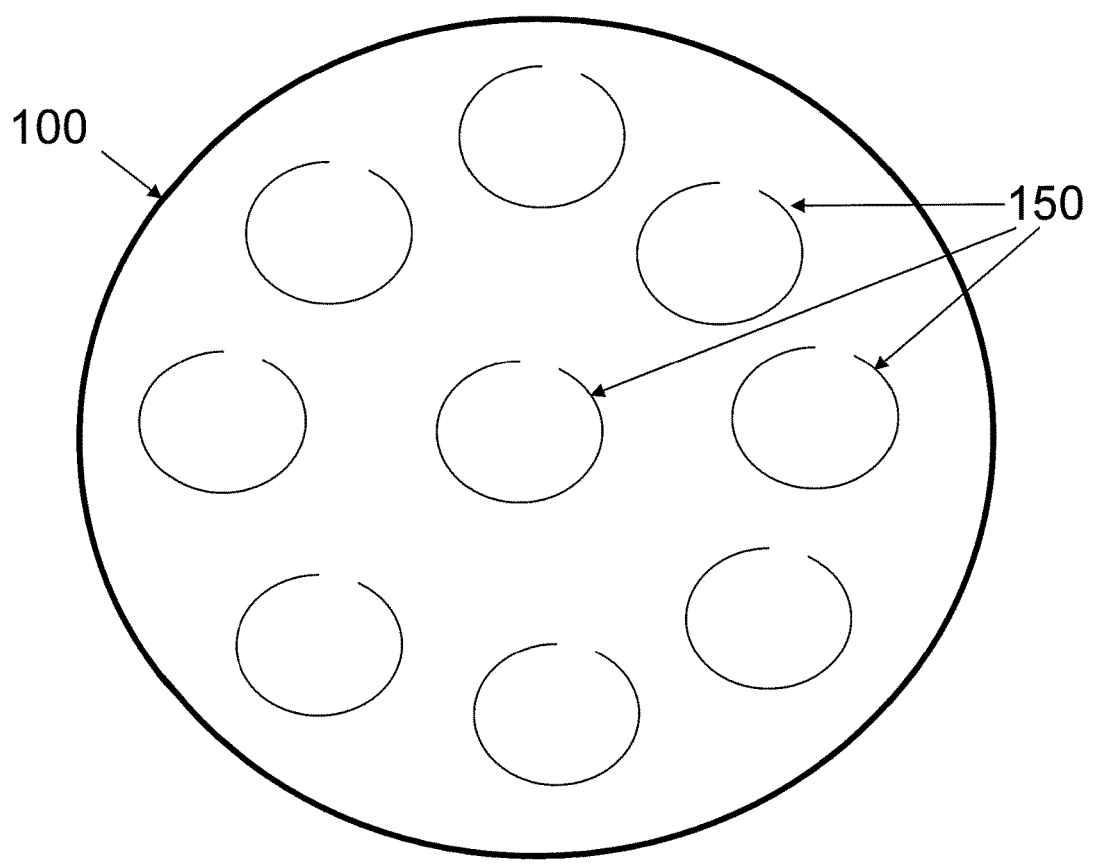
FIG. 6 shows a top view of a component of a substrate support assembly in accordance with a further embodiment.

FIG. 6 shows an embodiment of a component of a substrate support assembly 100 having circular current loops wherein controlling the direction of current in various current loops 150, more complex magnetic field patterns can be generated over the substrate. The embodiment of FIG. 6 comprises nine separate current loops 150, with eight outer current loops surrounding a center current loop. If desired, the total number of current loops 150 may be significantly more than nine, and can be as high as about two hundred. The more current loops 150, the more fine tuning capability imparted to the applied magnetic field over the substrate.

Figure 7:
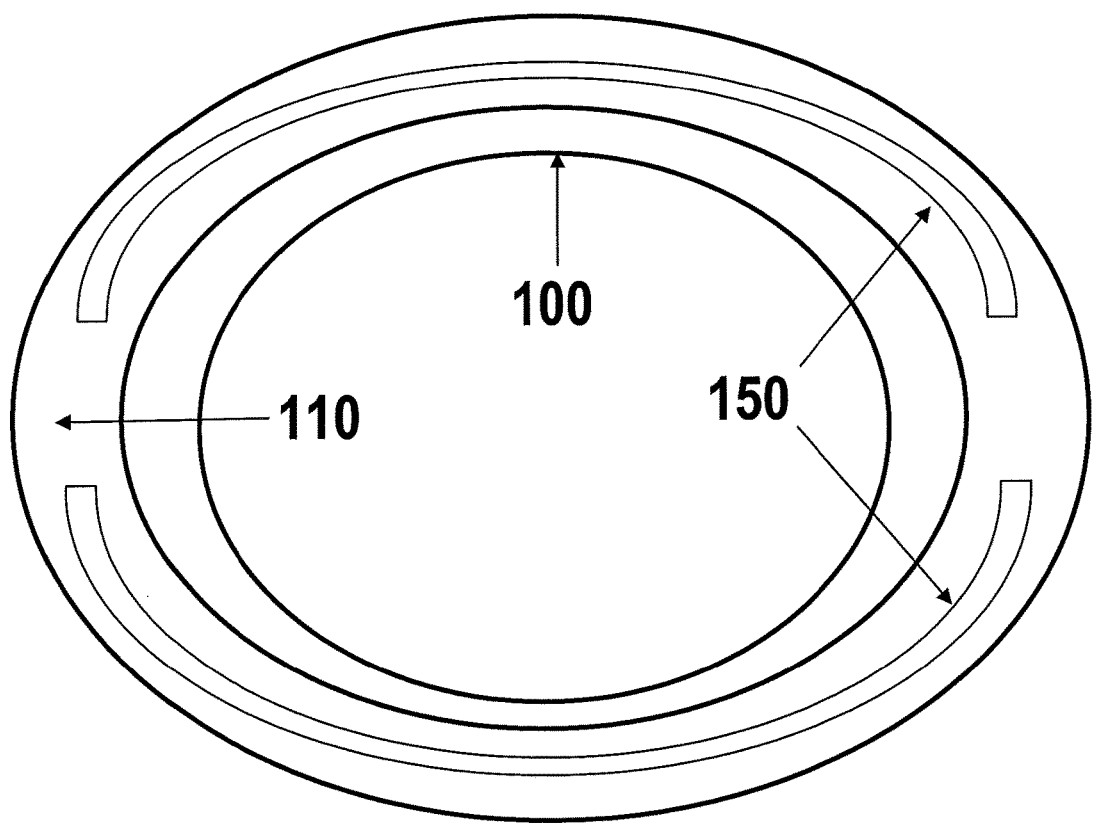
FIG. 7 shows a top view of a component in accordance with an embodiment that surrounds a substrate support.
Figure 8:
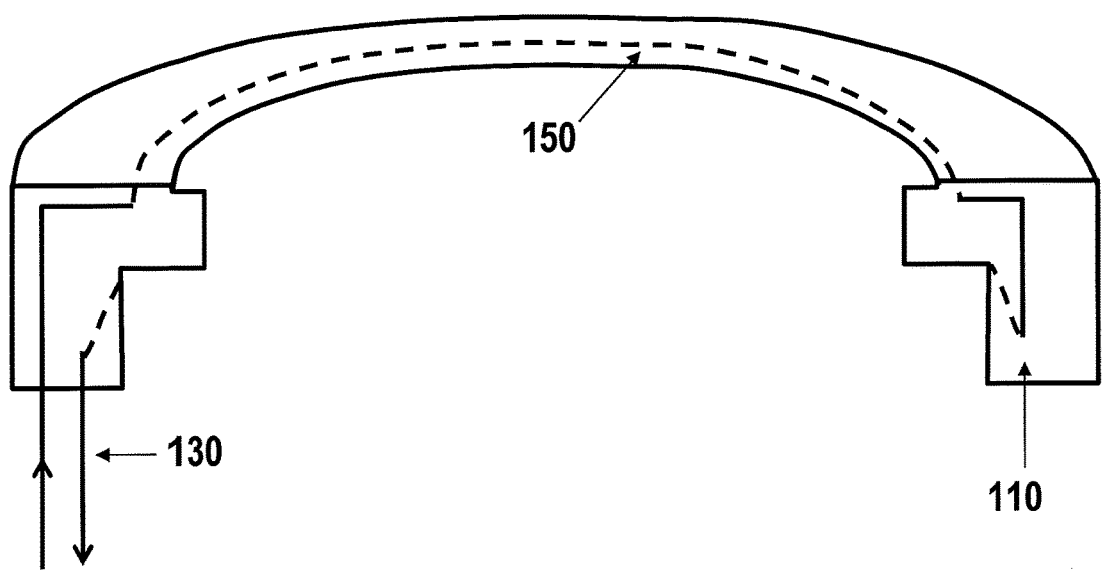
FIG. 8 shows a perspective view of a component in accordance with an embodiment that surrounds a substrate support.
Figure 9:
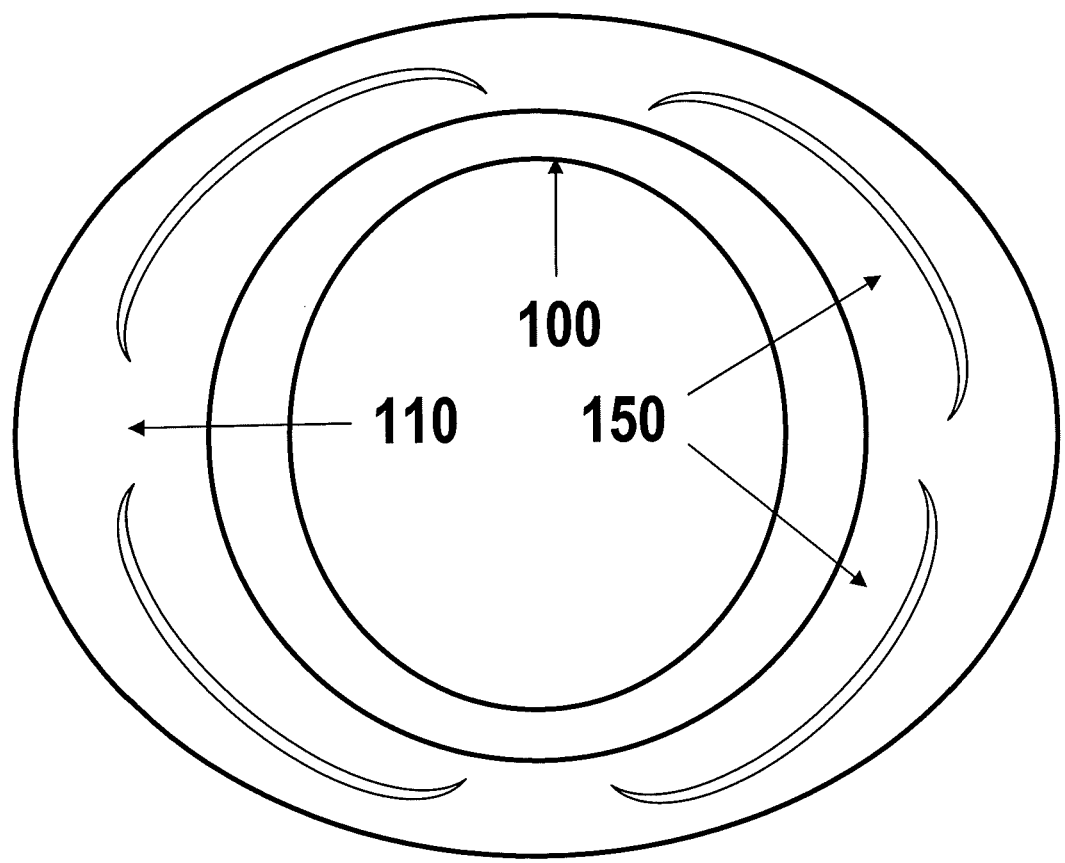
FIG. 9 shows a top view of a component in accordance with another embodiment that surrounds a substrate support.

FIG. 7 shows an embodiment of a substrate support assembly 100 wherein a component adapted to surround a substrate support 100 comprises at least one current loop 150, and wherein substrate support 100 does not comprise a current loop. The generation of the magnetic field from the component compensates for non-uniformity at the outermost edge of substrate 70. FIG. 7 shows an embodiment wherein an edge ring 110 comprises two current loops 150 disposed in a plane substantially parallel to an upper surface of substrate 70. The current loops 150 are formed into a block semi-circular shape that substantially surround substrate support 100 and are disposed on opposite sides of edge ring 110. The loops are independently operated with respect to each other such that two magnetic fields can be generated. The major legs of the current loops can be on the same or different planes. FIG. 8 shows a perspective view of current loop 150 disposed in edge ring 110. The loop includes major legs which are vertically offset with electrical leads 130 for power supply (up arrow) and power return (down arrow). The leads are spaced a few mm apart such that the magnetic fields generated on the leads, and particularly those proximate the current loop 150, cancel each other out and do not interfere in the magnetic field over the substrate 70 being etched (FIG. 2A). If desired, edge ring 110 may comprise more than two current loops 150. FIG. 9 shows an embodiment wherein edge ring 110 comprises four current loops 150 and wherein substrate support 100 does not comprise any current loops. Each of the four current loops 150 are arranged diametrically opposite to another one of the loops 150.

Figure 10:
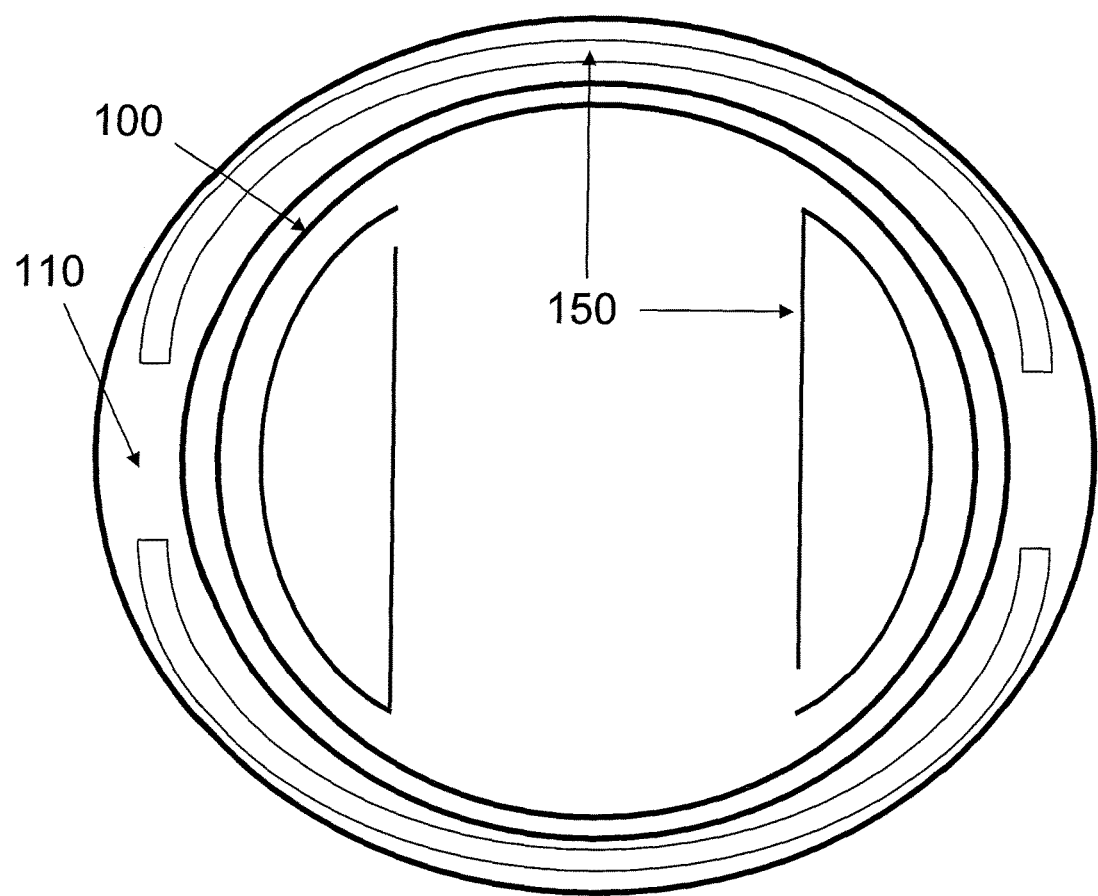
FIG. 10 shows a top view of a component of a substrate support in accordance with an embodiment and a component surrounding the substrate support in accordance with an embodiment.

FIG. 10 shows an embodiment of a component of a substrate support assembly 100 wherein both substrate support 100 and a component 110 surrounding the substrate support comprise at least one current loop 150. Adding at least one current loop 150 to such hardware, such as edge ring 110 surrounding the substrate support 100, extends the influence of the applied magnetic field over the substrate to the outermost edge of substrate 70. In the embodiment of FIG. 10, the substrate support 100 and edge ring 110 each comprise two current loops 150. The current loops incorporated in the substrate support are D-shaped with the straight legs facing each other. The current loops incorporated in the edge ring are offset 90° with respect to the current loops of the substrate support. The current loops 150 in the substrate support 100 and edge ring 110 may or may not be planar with respect to each other or with respect to a substrate surface. The current loops 150 in the edge ring 110 preferably extend around a substantial portion of its circumference.

Figure 11:
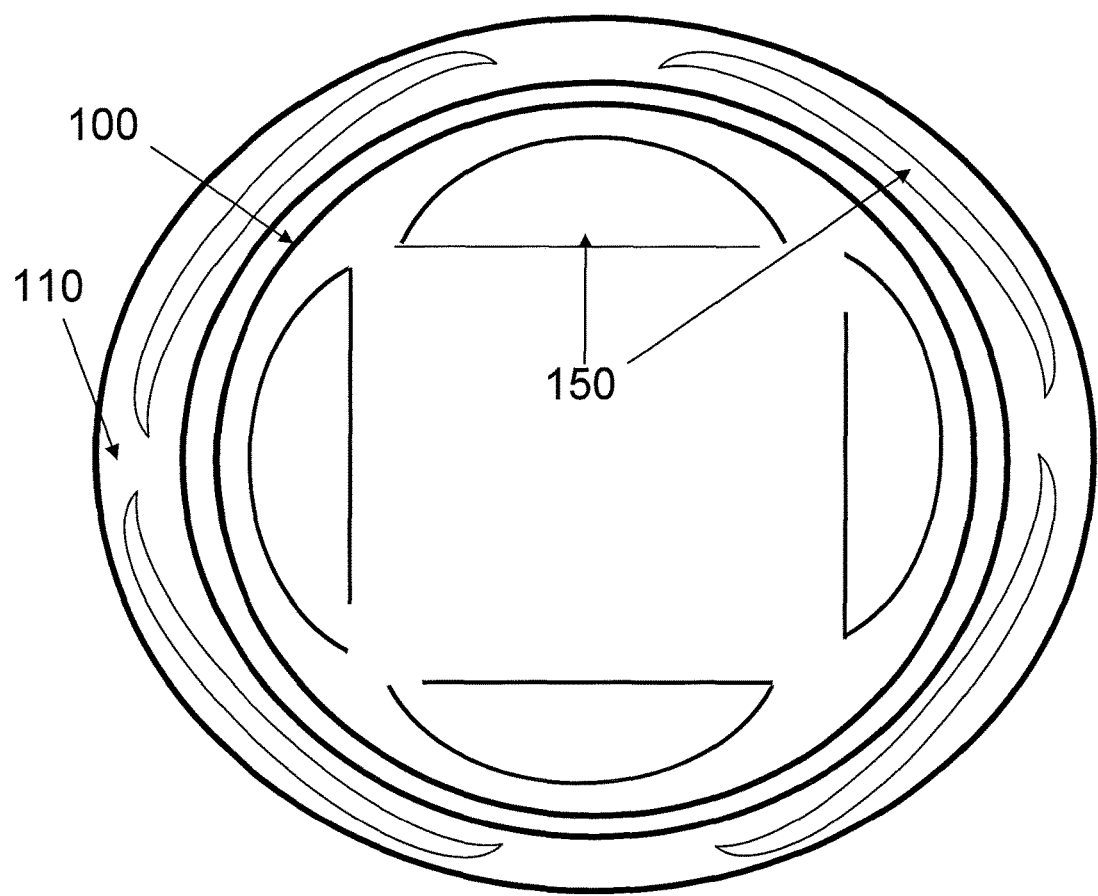
FIG. 11 shows a top view of a component of a substrate support in accordance with another embodiment and a component surrounding the substrate support in accordance with another embodiment.
Figure 12:
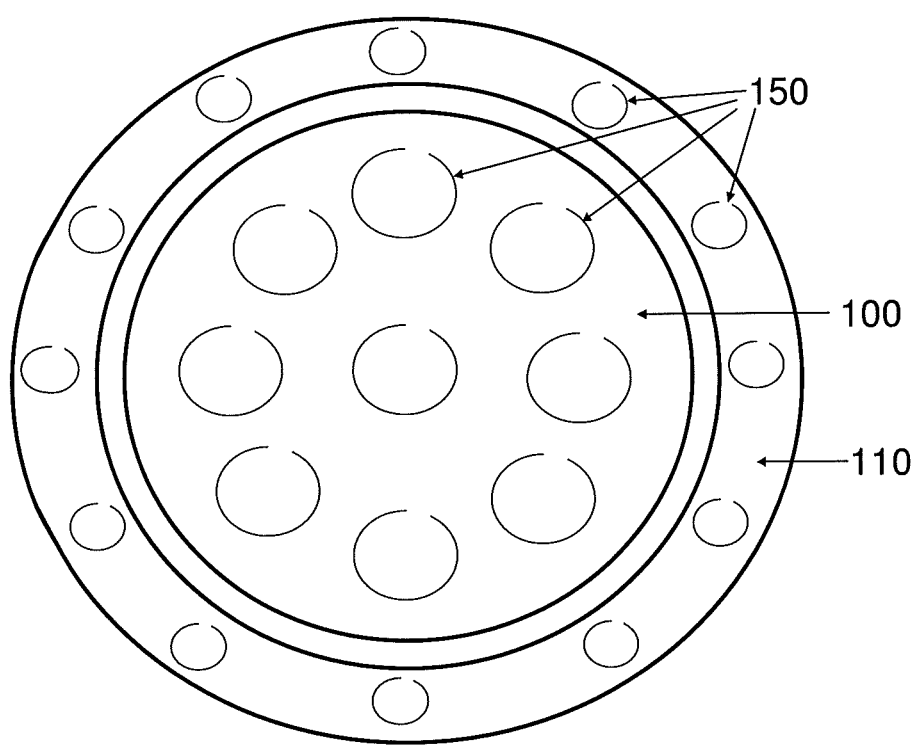
FIG. 12 shows a top view of a component of a substrate support in accordance with yet another embodiment and a component surrounding the substrate support in accordance with yet another embodiment.

The number of current loops 150 that the substrate support assembly 100 comprise may be greater than two, such as that shown in FIG. 11, wherein both substrate support 100 and edge ring 110 each comprise four current loops 150. FIG. 12 shows an embodiment of a substrate support assembly 100 wherein the support comprises nine current loops 150 and edge ring 110 comprises twelve current loops 150. The current loops 150 comprised in the substrate support or edge ring are laterally distributed in a symmetric manner.

The current loops can be incorporated in any type of substrate support which may or may not include an electrostatic clamping arrangement, heating arrangement and/or temperature controlled baseplate. In a preferred method of controlling and/or adjusting an etch rate pattern using a substrate support incorporating current loops, a substrate is supported on a substrate support comprising a baseplate, a thermal insulating layer disposed over the baseplate, a heating plate disposed over the thermal insulating layer, a ceramic plate disposed over the a thermal insulating layer; and current loops; etching a substrate disposed on the substrate support; detecting an etch rate non-uniformity, such as an azimuthal etch rate non-uniformity, after etching has been initiated; and providing one or more of the current loops with DC power to generate localized DC magnetic fields that correct and/or adjust the etch rate non-uniformity.

An azimuthal etch rate non-uniformity may be detected as follows. A substrate comprising a thin film, such as a polysilicon thin film in the case of semiconductor substrate, to be processed is inspected to determine the thickness of the thin film at various locations across the substrate using standard interferometry techniques. The substrate is then plasma etched, or partially etched. After etching, or partial etching, the thickness of the thin film is measured again using standard interferometry techniques. The difference between the two thin film thickness measurements is determined by an appropriate algorithm, which also is able to generate an etch pattern on the substrate surface. From an etch rate pattern, a mean depth of the film thickness left on the substrate is determined, along with other parameters, such as the standard deviation and global maximum and minimum depths. These parameters are used to determine where selective application of a magnetic field can be applied to correct and/or adjust an azimuthal etch rate non-uniformity during subsequent etching of a batch of wafers undergoing the same etch process.

Alternatively, incoming wafer thickness of a substrate can be measured, the B-field pattern to provide uniform etching can be determined, and etching of a batch of substrates can be carried out. In another method, a substrate can be etched, an azimuthal pattern for etching can be determined, the magnetic field compensation is determined and further substrates are etched while applying the magnetic field compensation. The etch rate or other parameters could be monitored during plasma etching and the current loops could be powered to compensate for local etch rate variation during the plasma etch process.

Example 1

Figure 13:
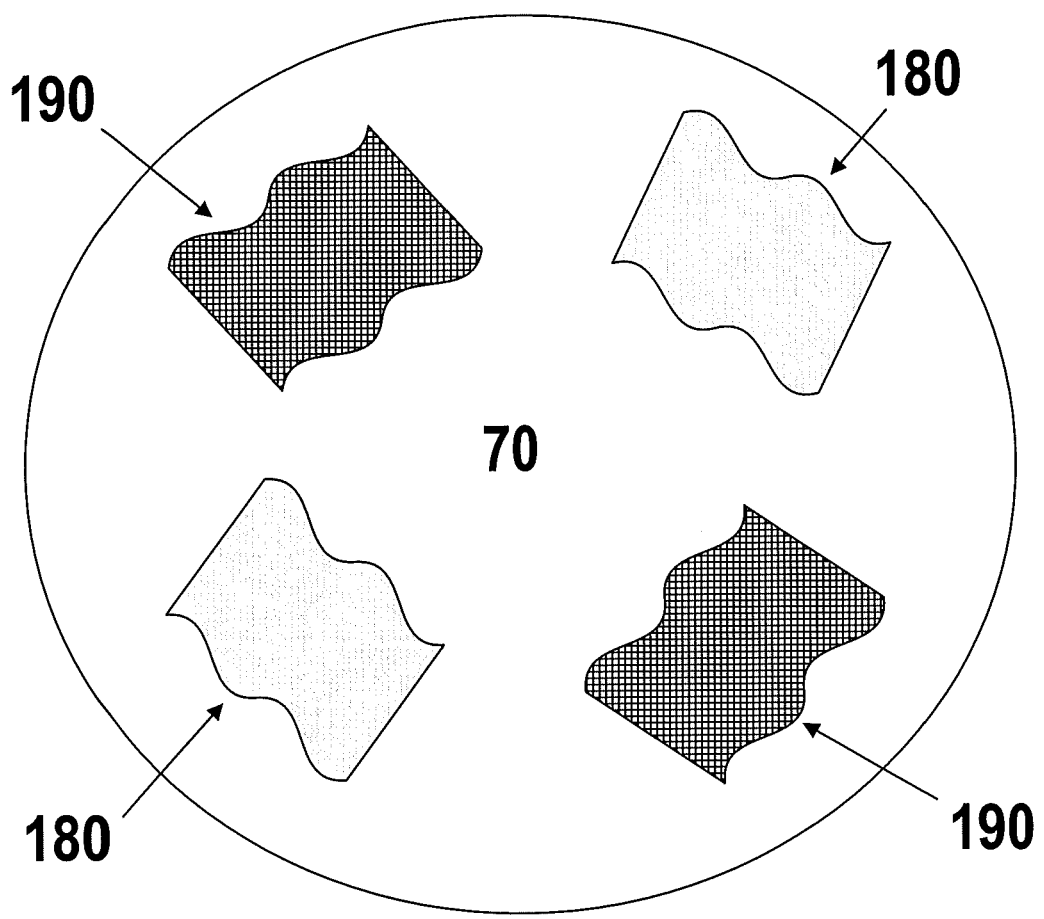
FIG. 13 shows a top view of an etch rate pattern after partial etching of a substrate.

A silicon wafer with a 1 μm thick silicon oxide film on its surface to be etched to a depth of about 400 nm is surrounded by an edge ring with two current loops, similar to the configuration of FIG. 7, wherein the supply trace and return trace are non-planar. Etching can be carried out using a fluorocarbon etching gas. The substrate is loaded into a plasma etch vacuum chamber and is partially etched to a depth of about 200 nm and then removed from the chamber. Interferometric techniques are used to determine the etch rate non-uniformity by measuring the film thickness profile over the substrate before and after partial etching. From these measurements, an algorithm is used to generate the etch rate pattern. After analysis of the pattern, parameters used to determine corrections and/or adjustments to be carried out to the azimuthal etch rate non-uniformity are determined. The partial etch is determined to result in average depth in the film of 192.4 nm, with a three-sigma standard deviation of 19.2 nm (10%). The difference between a global maximum and minimum is 31.9 nm (16.6%). Analysis of the etch rate pattern is shown in FIG. 13. Areas 190 (in black) on substrate 70 are shown to be etched with a faster etch rate than areas 180 (in gray).

Figure 14:
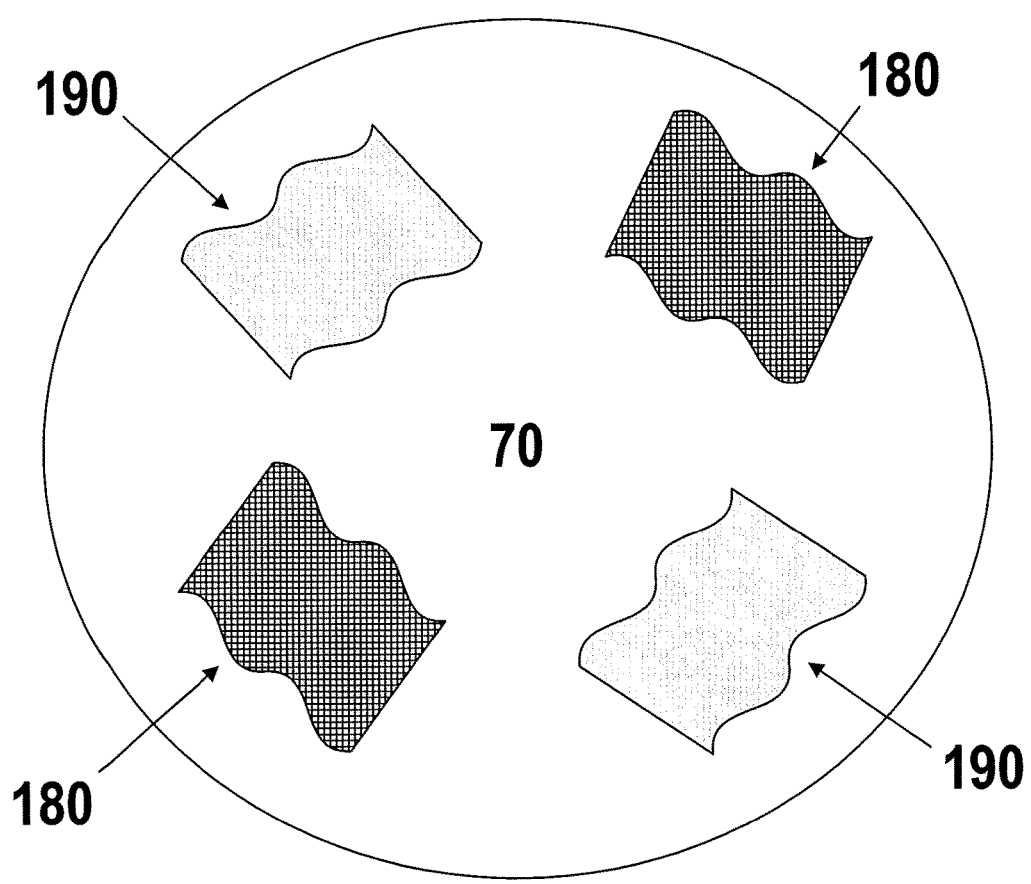
FIG. 14 shows a top view of an etch rate pattern after final etching of a substrate.

Etching the remaining portions of the film on substrate 70 is then carried out. During the subsequent etching, DC power is supplied to the current loops 150 disposed in edge ring 110. DC power is supplied such that an 3 Gauss magnetic field is generated by the loops 150. After completion of etching, the etch rate pattern is determined, as described above. This etch results in an average of 189.5 nm of film thickness removed, with a three-sigma standard deviation of 13.9 nm (7.3%). The difference between a global maximum and minimum is 25.2 nm (13.3%). Analysis of the etch rate pattern is shown in FIG. 14. Areas 190 (in gray) on substrate 70 are shown to be etched with a slower etch rate than areas 180 (in black).

Thus, etching a substrate in the presence of an applied DC magnetic field can compensate for etch rate non-uniformity and thus provide a more uniform etch rate. With an applied magnetic field of about 3 Gauss generated from current loops in an edge ring, azimuthal etch rate non-uniformity can be decreased by about 3.3.% (range after partial etch—range after final etch), with a decrease in the three-sigma standard deviation of about 2.7% (deviation after partial etch—deviation after final etch). Furthermore, application of an 3 Gauss magnetic field shows that areas etched at a faster etch rate in the partial etch can be etched at a slower etch rate in the final etch step, thus, correcting for an azimuthal etch rate non-uniformity. Similarly, application of an 3 Gauss magnetic field shows that the areas that are etched at a slower etch rate in the partial etch can be etched at a faster etch rate in the final etch step, thus, correcting for an azimuthal etch rate non-uniformity.

Example 2

In a process scheme to compensate for etch rate variation:
a. a wafer is partially etched and the etch rate non-uniformity is measured;
b. apply a magnetic field pattern to the plasma above a wafer (based on historical knowledge);
c. etch another wafer, determine etch pattern sensitivity to the applied magnetic field pattern since the applied field is known; and
d. optionally repeat steps a-c to determine an optimal magnetic field pattern.

Example 3

In a process scheme to compensate for incoming wafer thickness variation:

a. measure incoming wafer thickness variation;
b. apply a magnetic field pattern (based on historical knowledge);
c. etch a wafer, determine etch pattern sensitivity to the applied magnetic field pattern since the applied field is known; and
d. optionally repeat steps a-c and adjust the applied magnetic field pattern if necessary.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A component of a substrate support assembly useful for supporting individual semiconductor substrates undergoing plasma processing, the component comprising:
   an electrostatic chuck for supporting a semiconductor substrate during plasma processing thereof or an edge ring which surrounds the semiconductor substrate, wherein the electrostatic chuck includes an embedded electrode receiving a first voltage to electrostatically attract the semiconductor substrate to the substrate support assembly; and
   a plurality of current loops incorporated in the electrostatic chuck or the edge ring, the plurality of current loops being laterally spaced apart and extending less than halfway around the electrostatic chuck or edge ring, each of the plurality of current loops being a wire formed into a loop;
   one or more DC power sources electrically connected to the plurality of current loops; and
   a controller configured to:
   supply the first voltage to the embedded electrode;
   supply a DC current to the plurality of current loops from the one or more DC power sources, the DC current directly supplied to the plurality of current loops being separate from and in addition to the first voltage supplied to the embedded electrode; and
   control the one or more DC power sources such that each of the plurality of current loops is independently operable and generates a localized DC magnetic field above the semiconductor substrate supported on the electrostatic chuck when the DC current is applied to a current loop of the plurality of current loops during plasma processing of the semiconductor substrate to adjust or correct the plasma processing of the semiconductor substrate
   wherein the localized DC magnetic field generated by the plurality of current loops does not generate plasma.

2. The component of claim 1, wherein the electrostatic chuck includes a baseplate, a thermal insulating layer above the baseplate, and a ceramic plate with the embedded electrode above the thermal insulating layer; and the plurality of current loops are embedded in the baseplate or the ceramic plate such that the plurality of current loops lie substantially in a plane parallel to an upper surface of the semiconductor substrate.

3. The component of claim 1, wherein the plurality of current loops are embedded in the edge ring such that the plurality of current loops lie substantially in a plane parallel to an upper surface of the semiconductor substrate.

4. The component of claim 1, wherein the plurality of current loops includes up to 200 current loops that have the same size and a circular shape and that are embedded in the electrostatic chuck or the edge ring.

5. The component of claim 1, wherein each of the plurality of current loops has a circular, semi-circular, oval, semi-oval, square, rectangular, trapezoidal, triangular or polygonal shape.

6. The component of claim 1, wherein the wire has a diameter of between about 0.5-10 mm.

7. The component of claim 1, wherein a periphery of each current loop of the plurality of current loops is laterally offset from a periphery of an adjacent current loop of the plurality of current loops.

8. A plasma processing chamber incorporating the component of claim 1, wherein the electrostatic chuck includes a heater layer having a plurality of heaters laterally distributed across the electrostatic chuck and operable to tune a spatial temperature profile for critical dimension (CD) control, the plurality of current loops including at least 9 current loops distributed laterally across the electrostatic chuck and operable to compensate for local non-uniformity in processing on the semiconductor substrate.

9. The plasma processing chamber of claim 8, wherein the plasma processing chamber is a plasma etching chamber.

10. The plasma processing chamber of claim 8, wherein the controller is configured to control the one or more DC power sources such that the one or more DC power sources supply the DC current to the plurality of current loops at the same time or different times with the same or different levels of the DC current, and wherein the DC current flows in the plurality of current loops in the same direction or different directions.

11. A method of controlling and/or adjusting a magnetic field pattern during plasma processing of the semiconductor substrate undergoing processing in the plasma processing chamber of claim 8, comprising:
   a) supporting the semiconductor substrate on the electrostatic chuck;
   b) plasma processing the semiconductor substrate; and
   c) supplying at least one of the plurality of current loops with the DC current to generate the localized DC magnetic field in a region above the semiconductor substrate so as to compensate for local non-uniformity in processing.

12. The method of claim 11, further comprising supplying the plurality of current loops with different amounts of the DC current, with the DC current travelling in a clockwise direction in each of the plurality of current loops.

13. The method of claim 11, further comprising supplying the plurality of current loops with different amounts of the DC current, with the DC current travelling in different directions in some of the plurality of current loops.

14. The method of claim 11, wherein each of the plurality of current loops generates the localized DC magnetic field above the semiconductor substrate with a field strength of less than 1 Gauss.

15. The method of claim 14, wherein the field strength is less than 20 Gauss or less than 0.5 Gauss.

16. The method of claim 11, wherein the plurality of current loops includes at least two current loops, and wherein the electrostatic chuck is surrounded by an edge ring having the at least two current loops, with each of the at least two current loops arranged on an opposite side of the edge ring.

17. The method of claim 16, wherein the plurality of current loops includes at least four current loops; wherein the edge ring has the at least four current loops, with each of the at least four current loops arranged diametrically opposite to another one of the at least four current loops; and wherein each of the at least four current loops has a circular, semi-circular, oval, semi-oval, square, rectangular, trapezoidal, triangular or polygonal shape.

18. The method of claim 11, wherein the plasma processing is plasma etching and further comprising, after steps a) and b) and prior to step c):
   removing the semiconductor substrate from the plasma processing chamber;
   detecting an etch-rate non-uniformity in an etch-rate pattern on the semiconductor substrate; and
   modifying step c) so as to compensate for film thickness induced etch-rate non-uniformity, etch chamber induced etch-rate non-uniformity or plasma induced etch-rate non-uniformity.

19. The method of claim 11, wherein the DC current is supplied from the one or more DC power sources comprising a multiplexed power scheme.

20. The method of claim 11, wherein the electrostatic chuck is adapted to support the semiconductor substrate having a diameter of at least about 200 mm, at least about 300 mm or at least about 450 mm.

\* \* \* \* \*